US010564748B2

(12) United States Patent
Koide

(10) Patent No.: US 10,564,748 B2
(45) Date of Patent: Feb. 18, 2020

(54) TOUCH SENSOR AND DISPLAY DEVICE INCLUDING A TOUCH SENSOR AND TOUCH SENSOR DRIVING CIRCUIT

(71) Applicant: Japan Display Inc., Minato-ku (JP)

(72) Inventor: Gen Koide, Tokyo (JP)

(73) Assignee: Japan Display Inc., Minato-ku (JP)

( * ) Notice: Subject to any disclaimer, the term of this patent is extended or adjusted under 35 U.S.C. 154(b) by 143 days.

(21) Appl. No.: 15/661,072

(22) Filed: Jul. 27, 2017

(65) Prior Publication Data

US 2018/0032194 A1 Feb. 1, 2018

(30) Foreign Application Priority Data

Jul. 29, 2016 (JP) .................. 2016-149575

(51) Int. Cl.
| G06F 3/041 | (2006.01) |
| G06F 3/044 | (2006.01) |
| G11C 19/28 | (2006.01) |
| G09G 3/36 | (2006.01) |
| G02F 1/1333 | (2006.01) |
| G02F 1/1339 | (2006.01) |
| G02F 1/1362 | (2006.01) |
| G02F 1/1368 | (2006.01) |

(52) U.S. Cl.
CPC ............ *G06F 3/0412* (2013.01); *G06F 3/044* (2013.01); *G06F 3/0416* (2013.01); *G11C 19/287* (2013.01); *G02F 1/1339* (2013.01); *G02F 1/1368* (2013.01); *G02F 1/13338* (2013.01); *G02F 1/136286* (2013.01); *G02F 2201/121* (2013.01); *G09G 3/3648* (2013.01); *G09G 2310/08* (2013.01)

(58) Field of Classification Search
CPC ........................... G06F 3/0412; G11C 19/287
See application file for complete search history.

(56) References Cited

U.S. PATENT DOCUMENTS

| 2010/0128009 A1* | 5/2010 | Okada ................ G09G 3/3655 345/205 |
| 2012/0092317 A1* | 4/2012 | Yamamoto .......... G09G 3/3655 345/209 |
| 2012/0092323 A1* | 4/2012 | Murakami .......... G09G 3/3677 345/211 |
| 2012/0105337 A1* | 5/2012 | Jun ...................... G06F 3/0412 345/173 |
| 2012/0200614 A1* | 8/2012 | Yamamoto .......... G09G 3/3614 345/690 |

(Continued)

FOREIGN PATENT DOCUMENTS

JP 2002-040465 2/2002

*Primary Examiner* — William Boddie
*Assistant Examiner* — Andrew B Schnirel
(74) *Attorney, Agent, or Firm* — Oblon, McClelland, Maier & Neustadt, L.L.P.

(57) ABSTRACT

According to one embodiment, a sensor including a first drive electrode, a second drive electrode disposed to be adjacent to the first drive electrode, a third drive electrode disposed to be adjacent to the second drive electrode, a first shift register circuit connected to the first drive electrode, a second shift register circuit connected to the first shift register circuit and the third drive electrode, and an OR circuit connected to the second drive electrode, the first shift register circuit, and the second shift register circuit.

9 Claims, 9 Drawing Sheets

(56) References Cited

U.S. PATENT DOCUMENTS

| | | | |
|---|---|---|---|
| 2016/0049208 A1* | 2/2016 | Zheng | G09G 3/20 345/212 |
| 2016/0189677 A1* | 6/2016 | Cao | G11C 19/287 345/691 |
| 2016/0247446 A1* | 8/2016 | Cao | G09G 3/3225 |

* cited by examiner

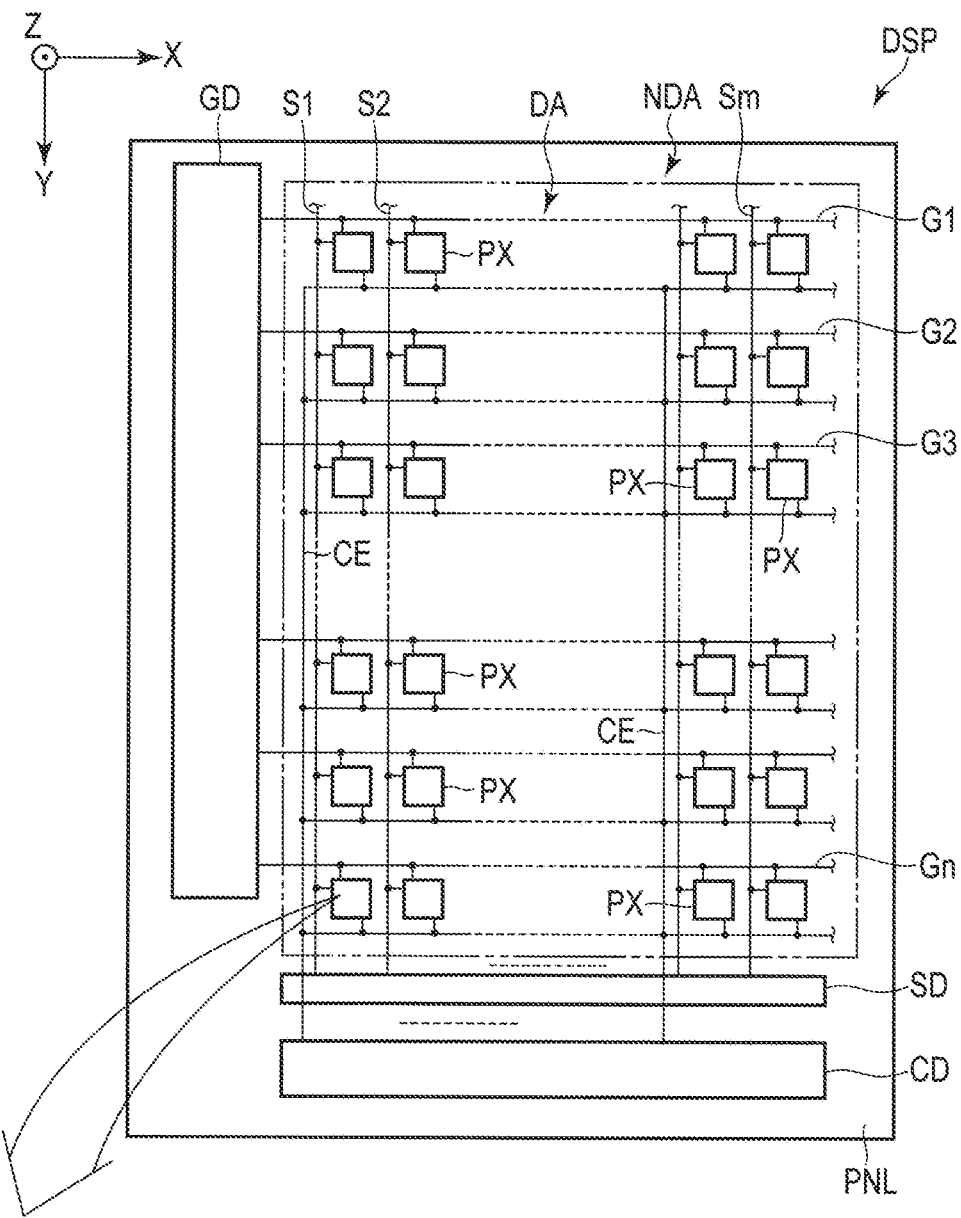
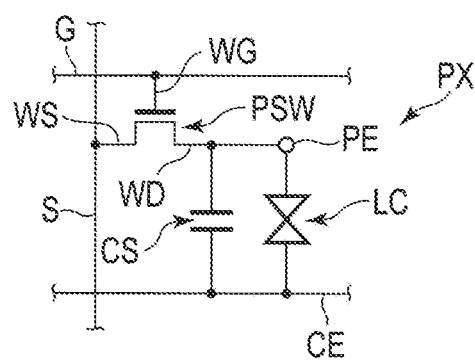
F I G. 2

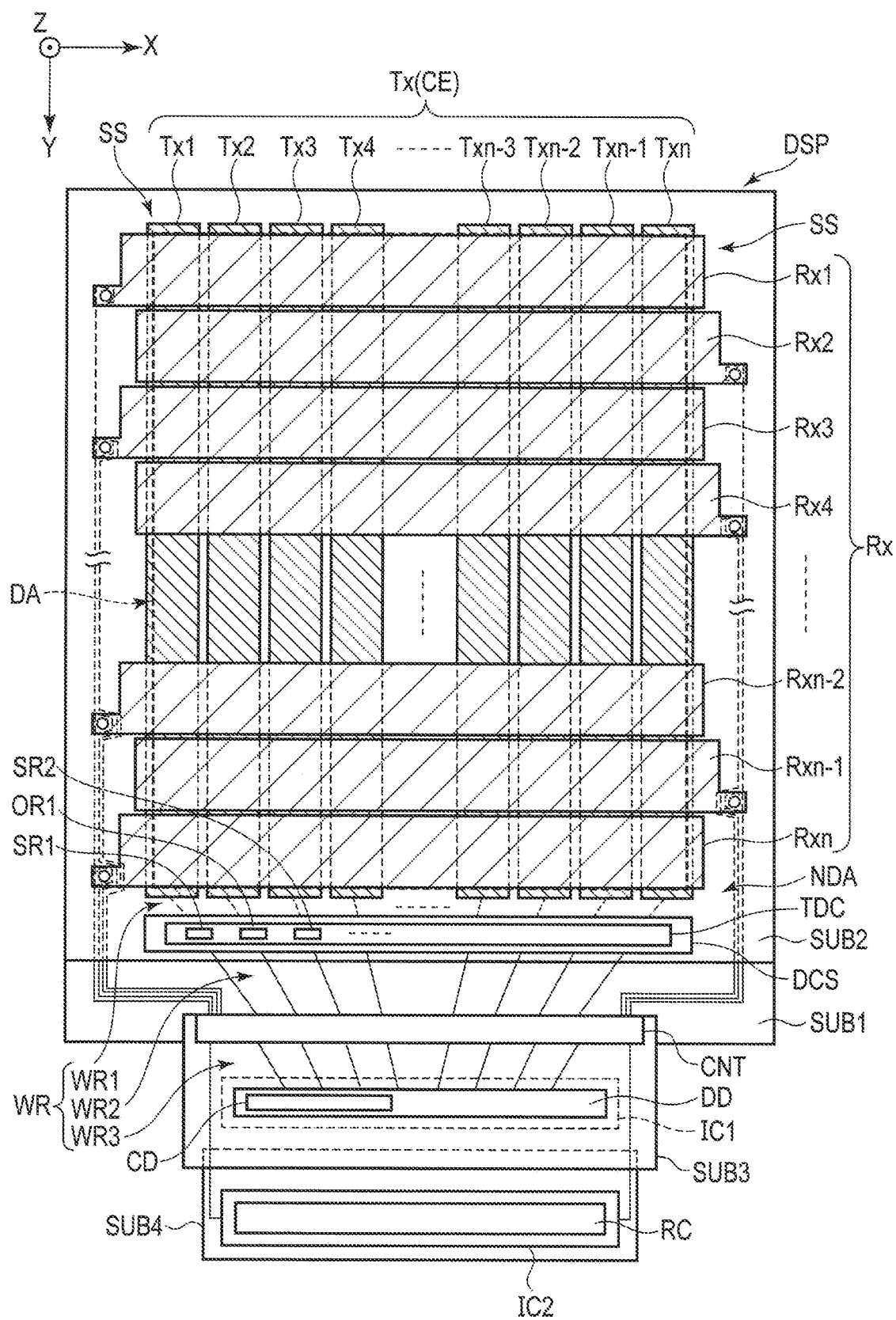
F I G. 4

TOUCH SENSOR AND DISPLAY DEVICE INCLUDING A TOUCH SENSOR AND TOUCH SENSOR DRIVING CIRCUIT

CROSS-REFERENCE TO RELATED APPLICATIONS

This application is based upon and claims the benefit of priority from Japanese Patent Application No. 2016-149575, filed Jul. 29, 2016, the entire contents of which are incorporated herein by reference.

FIELD

Embodiments described herein relate generally to a sensor and a display device.

BACKGROUND

In recent years, various techniques for narrowing a frame of a display device have been studied. For example, disclosed is a technique in which a wiring having a connector inside a hole penetrating an inner surface and an outer surface of a first substrate made of resin and a wiring provided on an inner surface of a second substrate made of resin are electrically connected to each other by another connector.

BRIEF DESCRIPTION OF THE DRAWINGS

FIG. 2 is a diagram illustrating a basic configuration of a display panel shown in FIG. 1 and an equivalent circuit;

FIG. 4 is a plan view illustrating a configuration example of a sensor;

DETAILED DESCRIPTION

Figure 1:
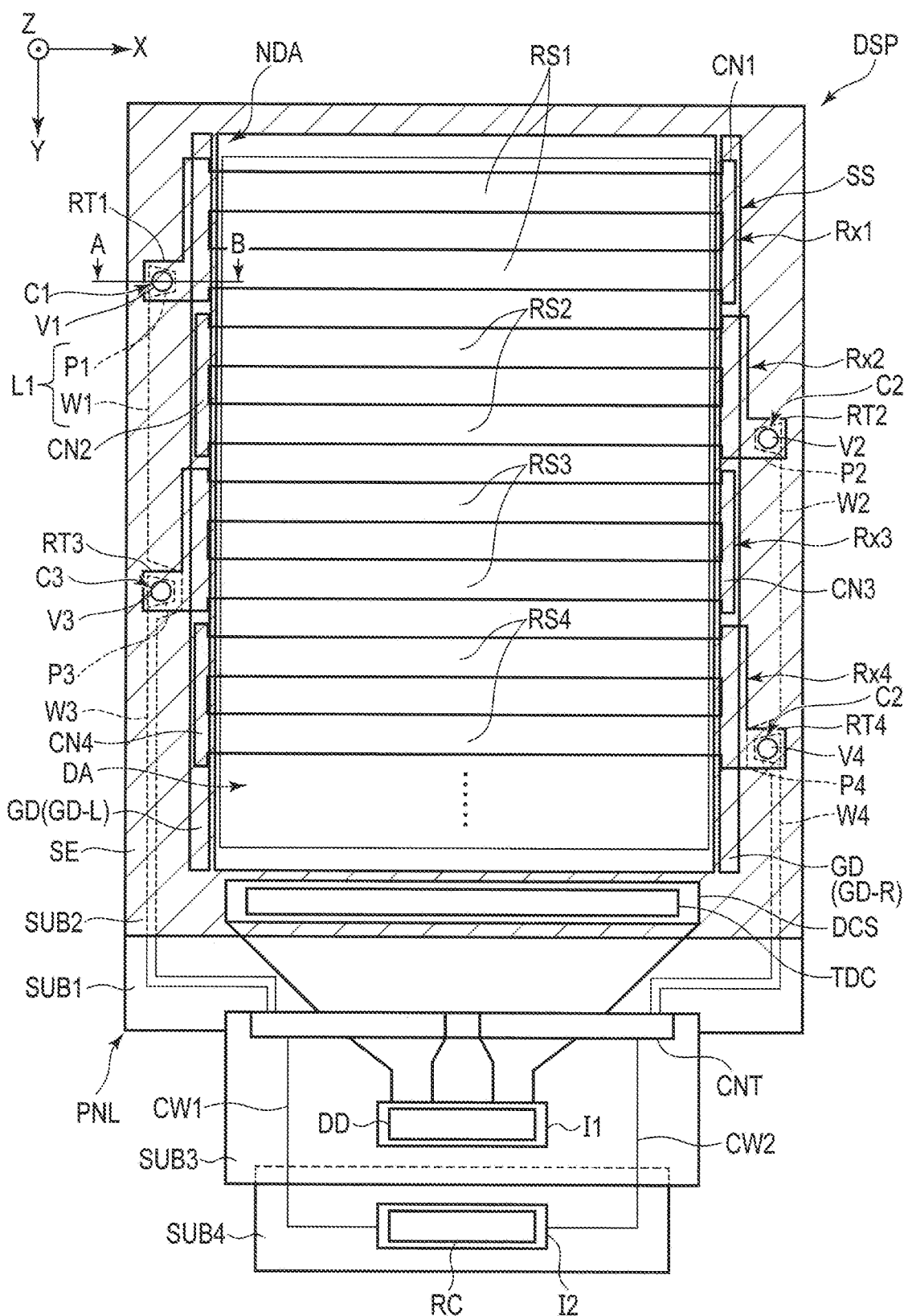
FIG. 1 is a cross-sectional view illustrating a configuration example of a display device according to an embodiment.

In general, according to one embodiment, a sensor comprises: a first drive electrode; a second drive electrode disposed to be adjacent to the first drive electrode; a third drive electrode disposed to be adjacent to the second drive electrode; a first shift register circuit connected to the first drive electrode; a second shift register circuit connected to the first shift register circuit and the third drive electrode; and an OR circuit connected to the second drive electrode, the first shift register circuit, and the second shift register circuit.

According to another embodiment, a sensor comprises: a plurality of drive electrodes arranged in one direction; a plurality of shift register circuits which sequentially enable selection of the plurality of drive electrodes; and at least one OR circuit which enables selection of one drive electrodes among the plurality of drive electrodes based on output signals of at least two shift register circuits among the plurality of shift register circuits.

According to another embodiment, a display device comprising: a sensor that comprises a plurality of drive electrodes arranged in one direction, a plurality of shift register circuits which sequentially enable selection of the plurality of drive electrodes, at least one OR circuit which enables selection of one drive electrodes among the plurality of drive electrodes based on output signals of at least two shift register circuits among the plurality of shift register circuits, a driver which inputs a start pulse signal and a clock signal to a first shift register circuit among the plurality of shift register circuits, and supplies a drive signal to at least one drive electrode among the plurality of drive electrodes set to be selectable by the plurality of shift register circuits and the OR circuit, and a detection electrode which are opposed to the plurality of drive electrodes and form capacitances, respectively, with the plurality of drive electrodes; and a display pixel that is opposed to the plurality of drive electrodes and performs display based on an image signal, wherein the driver executes image display driving to sequentially supply the image signal to the plurality of drive electrodes and detection driving to sequentially supply the drive signal.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, structural elements equivalent or similar to those described in connection with preceding figures are denoted by the same reference numbers and their detailed descriptions may be omitted unless necessary, in the specification and drawings.

In the embodiment, a display device is disclosed as an example of an electronic device. This display device can be used for various devices, for example, a smartphone, a tablet terminal, a mobile phone terminal, a notebook-type personal computer, a game machine, and the like. A principal configuration disclosed in the embodiment can be applied in a liquid crystal display device, a self-luminous display device such as an organic electroluminescent display device, an electronic paper-type display device including an electrophoretic element and the like, a display to which micro electro mechanical systems (MEMS) are applied, or a display device to which electrochromism is applied.

FIG. 1 is a plan view illustrating a configuration example of a display device DSP according to the embodiment. Here, a liquid crystal display device equipped with a sensor SS will be described as an example of the display device DSP. A first direction X, a second direction Y, and a third direction Z are orthogonal to each other, but they may intersect each other at an angle other than 90 degrees. The first direction X and the second direction Y correspond to directions parallel to a surface of a substrate forming the display device DSP and the third direction Z corresponds to a thickness direction of the display device DSP. Here, a plan view of the display device DSP in an XY plane defined by the first direction X and the second direction Y is illustrated. In the following description, to view the X-Y plane from the third direction Z will be referred to as a plan view. The display device DSP includes a display panel PNL, an IC chip I1, an IC chip I2, a wiring board SUB3, a wiring board SUB4, a sensor SS, and the like.

The display panel PNL is a liquid crystal display panel, and includes a first substrate SUB1, a second substrate SUB2, a seal SE, a display function layer (a liquid crystal layer LC to be described later), scanning line driving circuits GD (GD-L and GD-R), a driving circuit system DCS, and a terminal CNT. The second substrate SUB2 is opposed to the first substrate SUB1. The seal SE corresponds to a part indicated by oblique lines in FIG. 1, and bonds the first substrate SUB1 and the second substrate SUB2 to each other. In the following description, a direction from the first substrate SUB1 toward the second substrate SUB2 in a direction perpendicular to the XY plane, for example, in the third direction Z will be referred to as an upper side (or simply above), and a direction from the second substrate SUB2 toward the first substrate SUB1 will be referred to as a lower side (or simply below). The display panel PNL may be any type, for example, among a transmissive type having a transmissive display function of displaying an image by selectively transmitting light from the lower side of the first substrate SUB1, a reflective type having a reflective display function of displaying an image by selectively reflecting light from the upper side of the second substrate SUB2, or a transflective type having the transmissive display function and the reflective display function.

The display panel PNL includes a display area DA to display an image and a frame-shaped non-display area NDA surrounding the display area DA. The display area DA corresponds to, for example, a first area, and is located at an inner side that is surrounded by the seal SE. The non-display area NDA corresponds to, for example, a second area adjacent to the display area (first area) DA. The seal SE is located in the non-display area NDA. The scanning line driving circuits GD (GD-L and GD-R) are located in the non-display area NDA. The driving circuit system DCS is provided in the first substrate SUB1. In the example illustrated in the drawing, the driving circuit system DCS is located in the non-display area NDA. The driving circuit system DCS includes a touch driving circuit TDC. The terminal CNT is located on the first substrate SUB1 extending to the outer side of the second substrate SUB2. The terminal CNT electrically connects various wirings and the like.

The IC chip I1 is mounted on the wiring board SUB3. The IC chip I1 is connected to the terminal CNT via a wiring or the like. It should be noted that the IC chip I1 is not limited to the example illustrated in the drawing, and may be mounted on the first substrate SUB1 extending to the outer side of the second substrate SUB2 or may be mounted on the wiring board SUB4 connected to the wiring board SUB3. For example, a display driver DD which outputs a signal necessary to display the image is incorporated in the IC chip I1. Here, the display driver DD includes at least a part of a signal line driving circuit SD, a scanning line driving circuit GD, and a common electrode driving circuit CD. It should be noted that there is a case where functions and configurations of the signal line driving circuit SD, the scanning line driving circuit GD, the common electrode driving circuit CD, and the like are expressed as the IC chip I1 or the display driver DD.

The IC chip I2 is mounted on the wiring board SUB4 connected to the wiring board SUB3. The IC chip I2 is connected to the terminal CNT via wirings CW1 and CW2. It should be noted that the IC chip I2 is not limited to the example illustrated in the drawing, and may be mounted on the first substrate SUB1 extending to the outer side of the second substrate SUB2 or may be mounted on the wiring board SUB3. The detection circuit (detector) RC functioning as a touch panel controller and the like is incorporated in the IC chip I2. The detection circuit RC may be incorporated in the IC chip I1 or the display driver DD, or may be incorporated in another IC chip different from the IC chips I1 and I2. In addition, there is a case where the function and configuration of the detection circuit RC is expressed as the IC chip I2.

The sensor SS performs sensing configured to detect contact or approach of an object to be detected with respect to the display device DSP although details thereof will be described later. The sensor SS includes the plurality of detection electrodes Rx (Rx1, Rx2, Rx3, Rx4, and so on), the touch driving circuit TDC, the common electrode driving circuit CD, the detection circuit RC, and the like. The sensor SS may include the display driver DD as the common electrode driving circuit CD, or may include the IC chip I2 as the detection circuit RC. In addition, the sensor SS does not necessarily include the common electrode driving circuit CD and the detection circuit RC. In addition, the sensor SS may include the first substrate SUB1 and the second substrate SUB2.

Each of the plurality of detection electrodes Rx is provided in the second substrate SUB2. The respective detection electrodes Rx extend in the first direction X and are aligned with an interval in the second direction Y. Each of the plurality of detection electrodes Rx (Rx1, Rx2, Rx3, Rx4, and so on) includes a detector RS (RS1, RS2, RS3, RS4, and so on) and a terminal RT (RT1, RT2, RT3, RT4, and so on), and a connection module CN (CN1, CN2, CN3, CN4, and so on).

The respective detectors RS are located in the display area DA and extend in the first direction X. In the detection electrode Rx, the detector RS is mainly used for sensing. In the example illustrated in the drawing, each of the detectors RS is illustrated on a strip, and more specifically, is formed by an aggregate of fine metal wires. Each of the detection electrodes Rx includes two detectors RS in the example illustrated in the drawing, but may include three or more detectors RS or one detector RS.

The plurality of terminals RT are connected to the detectors RS, respectively. In the example illustrated in the drawing, the respective terminals RT1, RT3, and so on of the odd-numbered detection electrodes Rx1, Rx3, and so on are located at one end side portion (first side portion) of the non-display area NDA. In addition, the respective terminals RT2, RT4, and so on of the even-numbered detection electrodes Rx2, Rx4, and so on are all located on the other end side portion (second side portion) of the non-display area NDA. In the first direction X, a direction in which the terminals RT1, RT3, and so on of the odd-numbered detection electrodes Rx1, Rx3, and so on are provided is referred to as left (left side), a direction opposite to the left direction (direction in which the terminals RT2, RT4, and so on of the even-numbered detection electrodes Rx2, Rx4, and so on are provided) is referred to as right (right side). In FIG. 1, the first side portion corresponds to an area on the left side of the display area DA, and the second side portion corresponds to an area on the right side of the display area DA. A part of the terminal RT is formed at a position overlapping the seal SE in a plan view.

On the other hand, the first substrate SUB1 includes a plurality of pads P (P1, P2, P3, P4, and so on) and a plurality of wirings W (W1, W2, W3, W4, and so on). In the example illustrated in the drawing, the odd-numbered pads P1, P3, and so on and wirings W1, W3, and so on are all located in the first side portion of the non-display area NDA. In addition, the even-numbered pads P2, P4, and so on and wirings W2, W4, and so on are all located on the second side portion of the non-display area NDA. Each of the pad P and the wiring W overlaps the seal SE in a plan view. Each of the pads P is formed at a position overlapping the corresponding terminal RT in a plan view. In the example illustrated in the drawing, each of the pads P is formed in a trapezoidal shape when viewed in a plan view. It should be noted that each of the pads P may have a shape other than the trapezoidal shape, for example, a polygonal shape, a circular shape, an elliptical shape, or the like when viewed in a plan view. Each of the wirings W is connected to the pad P, extends along the second direction Y, is connected to the terminal CNT, and is electrically connected to the detection circuit RC of the IC chip I2 disposed in the wiring board SUB4 via the terminal CNT. In the example illustrated in the drawing, the wirings W1 and W3 are connected to the wiring CW1 which is electrically connected to the detection circuit RC via the terminal CNT. Similarly, the wirings W2 and W4 are connected to the wiring CW2 which is electrically connected to the detection circuit RC via the terminal CNT.

As illustrated in the drawing, in the layout in which the pad P3 is disposed closer to the wiring board SUB3 than the pad P1, the wiring W1 bypasses the inner side of the pad P3 (that is, the direction in which the display area DA is provided) and is disposed between the pad P3 and the wiring board SUB3 side by side with the wiring W3 at the inner side of the wiring W3. In the same manner, the wiring W2 bypasses the inner side of the pad P4 and is disposed between the pad P4 and the wiring board SUB3 side by side with the wiring W4 at the inner side of the wiring W4.

A plurality of contact holes V (V1, V2, V3, V4, and so on) are formed, respectively, at positions at which the terminals RT (RT1, RT2, RT3, RT4, and so on) and the pads P (P1, P2, P3, P4, and so on) oppose each other. In addition, it is possible to form each of the plurality of contact holes V to penetrate the second substrate SUB2 including the terminal RT, and the seal SE and penetrate even the pad P. Each of the plurality of contact holes V has a circular shape in a plan view in the example illustrated in the drawing, but the shape thereof is not limited to the example illustrated in the drawing and may be another shape such as an elliptical shape. Connecting materials C (C1, C2, C3, C4, and so on) are provided in the plurality of contact holes V, respectively. The connecting materials C electrically connects the terminals RT and the pads P, respectively. That is, each of the plurality of detection electrodes Rx provided in the second substrate SUB2 is electrically connected to the detection circuit RC of the wiring board SUB3 which is connected to the pad P of the first substrate SUB1, via the connecting material C. The detection circuit RC reads a sensor signal output from each of the plurality of detection electrodes Rx and detects presence or absence of contact or approach of the object to be detected, a position coordinate of the object to be detected, and the like.

According to the layout of the display device DSP as described above, a width of the first side portion and a width of the second side portion in the non-display area NDA can be equalized, which is suitable for narrowing the frame.

FIG. 2 is a diagram illustrating a basic configuration of the display panel PNL shown in FIG. 1 and an equivalent circuit. The display panel PNL includes a plurality of pixels PX in the display area DA. Here, the pixel indicates a minimum unit that can be individually controlled according to a pixel signal, and for example, is present in an area including a switching element disposed at a position where a scanning line and a signal line, which will be described later, cross each other. The plurality of pixels PX are disposed in a matrix in the first direction X and the second direction Y. In addition, the display panel PNL includes a plurality of scanning lines G (G1 to Gn), a plurality of signal lines S (S1 to Sm), a common electrode CE, and the like in the display area DA. The scanning lines G extend in the first direction X and are aligned in the second direction Y. The signal lines S each extend in the second direction Y and are aligned in the first direction X. It should be noted that the scanning line G and the signal line S do not necessarily extend linearly, and each part thereof may be bent. The common electrode CE is disposed over the plurality of pixels PX. Each of the scanning line G, the signal line S, and the common electrode CE is led in the non-display area NDA. In the non-display area NDA, the scanning line G is connected to the scanning line driving circuit GD, the signal line S is connected to the signal line driving circuit SD, and the common electrode CE is connected to the common electrode driving circuit CD. Some or all of the signal line driving circuit SD, the scanning line driving circuit GD, and the common electrode driving circuit CD may be incorporated in the display driver DD shown in FIG. 1 or the IC chip I1, or may be formed on the first substrate SUB1.

Each of the pixels PX includes a switching element PSW, a pixel electrode PE, the common electrode CE, the liquid crystal layer LC, and the like. The switching element PSW is configured, for example, using a thin film transistor (TFT), and is electrically connected to the scanning line G and the signal line S. More specifically, the switching element PSW includes a gate electrode WG, a source electrode WS, and a drain electrode WD. The gate electrode WG is electrically connected to the scanning line G. In the example illustrated in the drawing, an electrode electrically connected to the signal line S is referred to as the source electrode WS, and an electrode electrically connected to the pixel electrode PE is referred to as the drain electrode WD.

The scanning line G is connected to the switching element PSW in each of the pixels PX aligned in the first direction X. The signal line S is connected to the switching element PSW in each of the pixels PX aligned in the second direction Y. Each of the pixel electrodes PE is opposed to the common electrode CE and drives the liquid crystal layer LC by an electric field generated between the pixel electrode PE and the common electrode CE. A storage capacitor CS is formed, for example, between the common electrode CE and the pixel electrode PE.

Figure 3A:
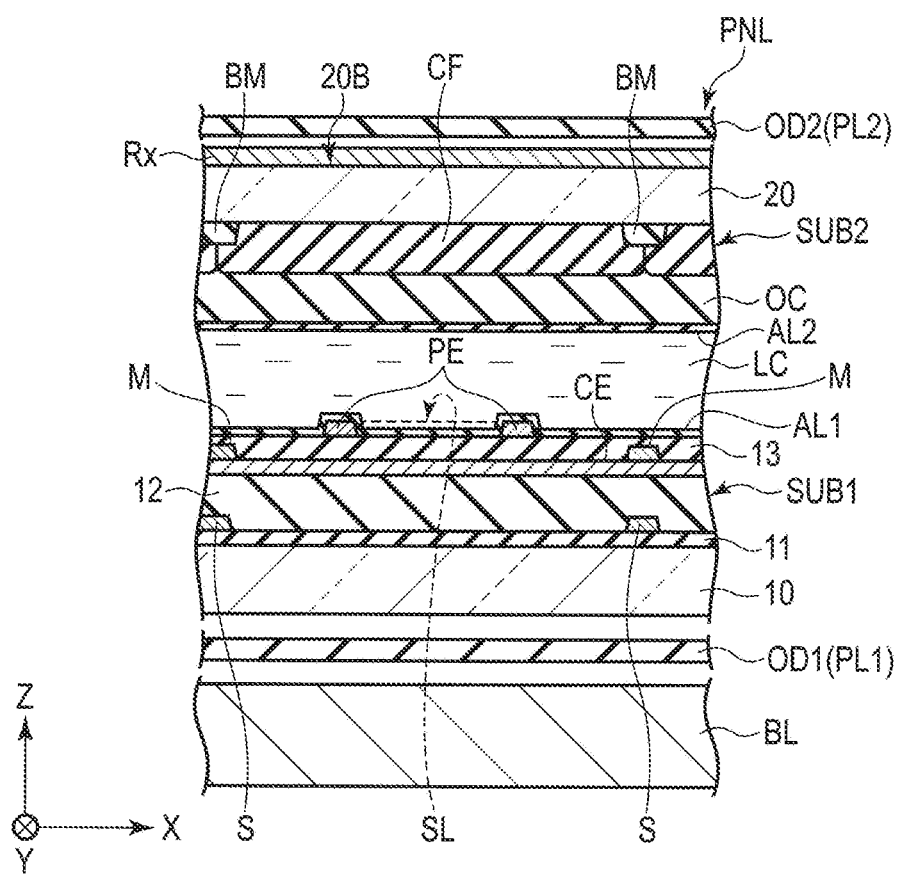
FIG. 3A is a cross-sectional view illustrating a structure of a part of the display panel shown in FIG. 1.

FIG. 3A is a cross-sectional view illustrating a structure of a part of the display panel PNL shown in FIG. 1. Here, the cross-sectional view of the display device DSP taken along the first direction X is illustrated.

The illustrated display panel PNL has a configuration corresponding to a display mode in which a lateral electric field, substantially parallel to the surface of the substrate is mainly used. It should be noted that the display panel PNL may have a configuration corresponding to a display mode in which a vertical electric field vertical to the surface of the substrate is used, an electric field in an oblique direction to the surface of the substrate is used, or both the electric fields are combinedly used. In the display mode of using the lateral electric field, for example, it is possible to apply a configuration in which both the pixel electrode PE and the common electrode CE are provided on any one of the first substrate SUB1 and the second substrate SUB2. In the display mode of using the vertical electric field and the oblique electric field, for example, it is possible to apply a configuration in which any one of the pixel electrode PE and the common electrode CE is provided in the first substrate SUB1 and the other one of the pixel electrode PE and the common electrode CE is provided in the second substrate SUB2. It should be noted that the substrate surface here is a surface parallel to the X-Y plane.

The first substrate SUB1 includes a first basement 10, the signal line S, the common electrode CE, a metal layer M, the pixel electrode PE, a first insulating layer 11, a second insulating layer 12, a third insulating layer 13, a first alignment film AL1, and the like. Here, the switching element, the scanning line, various insulating layers interposed therebetween and the like are not illustrated.

The first insulating layer 11 is located on the first basement 10. The scanning line and a semiconductor layer of the switching element (not illustrated) are located between the first basement 10 and the first insulating layer 11. Although not illustrated, provided is the structure in which the first basement 10, an undercoat film, a semiconductor layer, an insulating layer, a scanning wiring, and the first insulating layer 11 are sequentially stacked. The signal line S is located on the first insulating layer 11. The second insulating layer 12 is located on the signal line S and the first insulating layer 11. The common electrode CE is located on the second insulating layer 12. The metal layer M contacts the common electrode CE immediately above the signal line S. The metal layer M is located on the common electrode CE in the example illustrated in the drawing, but may be located between the common electrode CE and the second insulating layer 12. The third insulating layer 13 is located on the common electrode CE and the metal layer M. The pixel electrode PE is located on the third insulating layer 13. The pixel electrode PE is opposed to the common electrode CE via the third insulating layer 13. In addition, the pixel electrode PE has a slit SL at a position opposed to the common electrode CE. The first alignment film AL1 covers the pixel electrode PE and the third insulating layer 13.

The scanning line, the signal line S, and the metal layer M are formed using a metal material such as molybdenum, tungsten, titanium, and aluminum, and may have a single-layer structure or a multilayer structure. For example, the scanning wiring is made of a metal material containing molybdenum and tungsten, the signal line S is made of a metal material containing titanium and aluminum, and the metal layer M is made of a metal material containing molybdenum and aluminum. In this case, it is possible to say that the scanning line, the signal line S, and the metal layer M are metal materials different from each other. The common electrode CE and the pixel electrode PE are formed using a transparent conductive material such as ITO and IZO. The first insulating layer 11 and the third insulating layer 13 are inorganic insulating layers, and the second insulating layer 12 is an organic insulating layer.

The configuration of the first substrate SUB1 is not limited to the example illustrated in the drawing, and the pixel electrode PE may be located between the second insulating layer 12 and the third insulating layer 13, and the common electrode CE may be located between the third insulating layer 13 and the first alignment film AL1. In such a case, the pixel electrode PE is formed in a flat plate shape without a slit, and the common electrode CE has a slit opposed to the pixel electrode PE. In addition, both of the pixel electrode PE and the common electrode CE may be formed in a comb-teeth shape and disposed so as to be engaged with each other.

The second substrate SUB2 includes a second basement 20, a light shielding layer BM, a color filter CF, an overcoat layer OC, a second alignment film AL2, and the like.

The light shielding layer BM and the color filter CF are located on a side of the second basement 20 opposed to the first substrate SUB1. The light shielding layer BM partitions the respective pixels and is located immediately above the signal line S. The color filter CF is opposed to the pixel electrode PE, and a part thereof overlaps the light shielding layer BM. The color filter CF includes a red color filter, a green color filter, a blue color filter, and the like. The overcoat layer OC covers the color filter CF. The second alignment film AL2 covers the overcoat layer OC.

It should be noted that the color filter CF may be disposed in the first substrate SUB1. The color filter CF may include color filters of four or more colors. For pixels displaying white, a white color filter may be disposed, an uncolored resin material may be disposed, or the overcoat layer OC may be disposed without disposing a color filter.

The detection electrode Rx is located on a surface 20B of the second basement 20. The detection electrode Rx may be formed using a conductive layer containing a metal or a transparent conductive material such as ITO and IZO, a transparent conductive layer may be stacked on a conductive layer containing metal. The detection electrode Rx may be formed using a conductive organic material, a dispersion of a fine conductive material, or the like.

A first optical element OD1 including a first polarizing plate PL1 is located between the first basement 10 and an illumination device BL. A second optical element OD2 including a second polarizing plate PL2 is located above the detection electrode Rx. The first optical element OD1 and the second optical element OD2 may include a retardation plate if necessary.

Figure 3B:
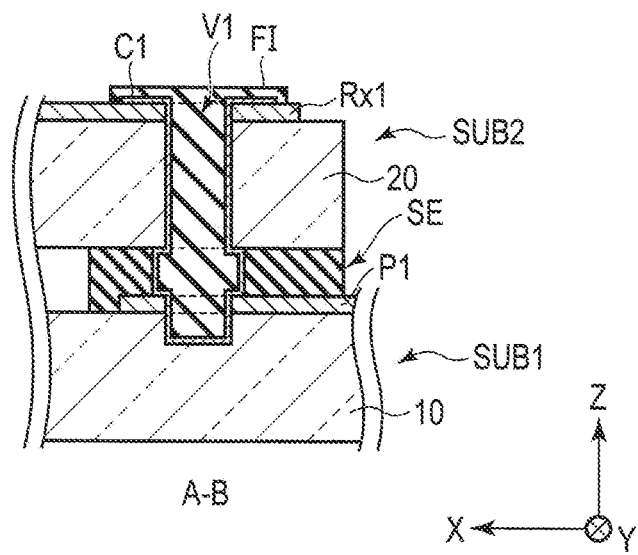
FIG. 3B is a cross-sectional view illustrating a part of the display device taken along line A-B shown in FIG. 1.

FIG. 3B is a cross-sectional view illustrating a structure of a part of the display device taken along line A-B shown in FIG. 1. FIG. 3B illustrates a configuration example in which the structure shown in FIG. 3 is simplified, for convenience of description. Hereinafter, the contact hole V1 will be described among the plurality of contact holes V formed in the display device DSP, for convenience of description. The same configuration can be also applied to the other contact holes V2, V3, V4, and so on. The first substrate SUB1 includes the first basement 10, the pad P1, the second conductive layer L2 in contact with the first conductive layer L1, and the second insulating layer 12. The second substrate SUB2 includes the second basement 20 and the detection electrode Rx1. The second substrate SUB2 is disposed to be opposed to the first substrate SUB1.

The first basement 10 and the second basement 20 are insulating substrates which are formed using, for example, alkali-free glass. For example, the pad P1 and the detection electrode Rx are formed using a metal material such as molybdenum, tungsten, titanium, aluminum, silver, copper, and chromium, an alloy obtained by combining these metallic materials, a transparent conductive material such as indium tin oxide (ITO) and indium zinc oxide (IZO), or the like, and may have a single-layer structure or a multilayer structure.

The seal SE is located between the first substrate SUB1 and the second substrate SUB2. In the example illustrated in the drawing, the seal SE is located between the overcoat layer OC and the surface 10A of the first basement 10, and a part thereof covers the first conductive layer L1 and the second conductive layer L2. It should be noted that an insulating layer, an overcoat layer, a light shielding layer, a color filter, an alignment film, and the like may be located between the first substrate SUB1 and the second substrate SUB2.

The hole V1 is provided to penetrate the first substrate SUB1, the seal SE, and the second substrate SUB2. The connecting material C1 is provided inside the contact hole V1, and electrically connects the pad P1 to the detection electrode Rx1. In the example illustrated in the drawing, filler FI is filled in a hollow portion inside the connecting material C1 in the contact hole V1 in order to protect the connecting material C1.

Next, a configuration example of the sensor SS mounted on the display device DSP according to the embodiment will be described. The sensor SS to be described hereinafter is, for example, an electrostatic capacitance type of a mutual capacitance type, and detects contact or approach of the object to be detected based on a change in electrostatic capacitance between a pair of electrodes opposed to each other via a dielectric.

FIG. 4 is a plan view illustrating a configuration example of the sensor SS. In the configuration example illustrated in the drawing, the sensor SS includes a plurality of sensor drive electrodes Tx (CE) (Tx1, Tx2, . . . , and Txn), the plurality of detection electrodes Rx, the common electrode driving circuit CD, the detection circuit RC, and the touch driving circuit TDC. In the example illustrated in the drawing, each of the plurality of sensor drive electrodes Tx corresponds to a part indicated by oblique lines descending to the right and is provided in the first substrate SUB1. In addition, each of the plurality of detection electrodes Rx (Rx1, Rx2, Rx3, . . . , and Rxn) correspond to a portion indicated by oblique lines ascending to the right and is provided in the second substrate SUB2. The sensor drive electrode Tx and the detection electrode Rx cross each other in the X-Y plane. The detection electrode Rx is opposed to the sensor drive electrode Tx in the third direction Z. In addition, the touch driving circuit TDC includes a plurality of shift registers SR (SR1, SR2, and so on) to be described later and a plurality of OR circuits OR (OR1, and so on) although details thereof will be described later.

The sensor drive electrode Tx and the detection electrode Rx are located in the display area DA, and each part thereof extends to the non-display area NDA. In the example illustrated in the drawing, the respective sensor drive electrodes Tx have a strip shape extending in the second direction Y and are disposed at an interval in the first direction X. The respective detection electrodes Rx extend in the first direction X and are disposed at an interval in the second direction Y. As described with reference to FIG. 1, the detection electrode Rx is connected to the pad provided in the first substrate SUB1 and is electrically connected to the detection circuit RC via the wiring. The plurality of sensor drive electrodes Tx are connected to the common electrode driving circuit CD via a plurality of wirings WR, respectively. The wirings WR includes a wiring WR1 which connects the sensor drive electrode Tx and the driving circuit system DCS, a wiring WR2 which connects the driving circuit system DCS and the terminal CNT, a wiring WR3 which connects the terminal CNT and the common electrode driving circuit CD of the display driver DD. Each number, size, and shape of the sensor drive electrodes Tx and the detection electrodes Rx are not particularly limited, and can be variously changed.

The sensor drive electrode Tx (CE) includes the above-described common electrode CE, has a function of generating an electric field with the pixel electrode PE, and has a function of detecting a position of an object to be detected by generating a capacitance with the detection electrode Rx). Each of the plurality of sensor drive electrodes Tx may include only the single common electrode CE or may include the plurality of common electrodes CE.

The common electrode driving circuit CD sequentially supplies a common drive signal to the sensor drive electrodes Tx including the common electrode CE at the time of display driving to display an image in the display area DA. In addition, the common electrode driving circuit CD sequentially supplies a sensor drive signal to the sensor drive electrodes Tx at the time of sensing driving to perform sensing. In accordance with the supply of the sensor drive signal to the sensor drive electrode Tx, the detection electrode Rx outputs a detection signal necessary for sensing (that is, a signal based on a change in inter-electrode capacitance between the sensor drive electrode Tx and the detection electrode Rx). The detection signal output from the detection electrode Rx is supplied to the detection circuit RC.

The sensor SS in the above-described configuration example is not limited to the mutual capacitance type, which detects the object to be detected based on the change in the electrostatic capacitance between the pair of electrodes (in the above-described example, the electrostatic capacitance between the sensor drive electrode Tx and the detection electrode Rx), but may be a self-capacitance type which detects the object to be detected is detected based on a change in electrostatic capacitance of the detection electrode Rx.

Figure 5:
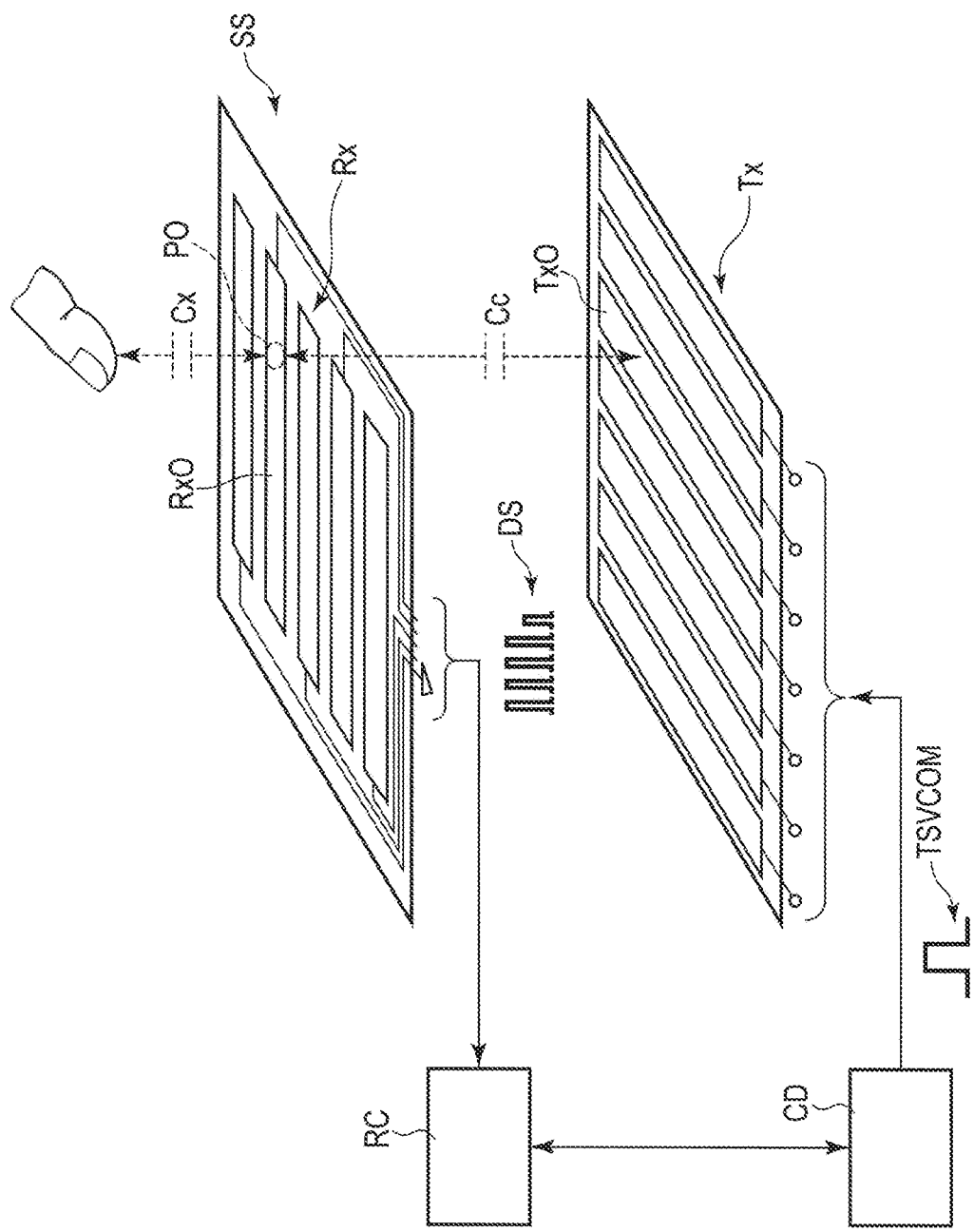
FIG. 5 is a diagram illustrating an example of sensing of the sensor.

FIG. 5 is a diagram illustrating an example of sensing of the sensor SS. In the example illustrated in the drawing, a capacitance Cc is present between the sensor drive electrode Tx and the detection electrode Rx, which are opposed to each other, in the sensor SS. In addition, a finger of a user, which is an object to be detected, is present to be adjacent to a position PO at which a particular detection electrode RxO among the detection electrodes Rx and a particular sensor drive electrode TxO among the sensor drive electrodes Tx cross each other when viewed in a plan view. In the example illustrated in the drawing, a capacitance Cx is generated between the object to be detected which is adjacent to the position PO and the particular detection electrode Rx.

In a touch position detection period, the sensor SS executes sensing when the sensor drive signal is being supplied to a particular sensor drive electrode among the sensor drive electrodes Tx from the common electrode driving circuit CD. The sensor SS causes transmission and reception of a signal between the common electrode driving circuit CD and the detection circuit RC at the time of sensing the position or the like of the object to be detected. For example, the sensor SS transmits and receives a signal for synchronization between the common electrode driving circuit CD and the detection circuit RC. The sensor SS sequentially supplies a pulsed sensor driving signal TSVCOM to each of the plurality of sensor drive electrodes Tx at a particular cycle, and acquires a detection signal DS from each of the plurality of detection electrodes Rx. In the detection circuit RC, the sensor SS detects the position of the object to be detected from a position of the particular sensor drive electrode to which the sensor drive signal TSVCOM has been supplied and a waveform of the acquired detection signal DS. Here, the calculation of the position of the object to be detected can be configured to be executed by an external device (not illustrated). In addition, the capacitance Cx is different between a case where the object to be detected is close to the detection electrode Rx and a case where the object to be detected is far from the detection electrode Rx. Thus, a signal level of the detection signal DS is also different between the case where the object to be detected is close to the detection electrode Rx and the case where the object to be detected is far from the detection electrode Rx. Therefore, the detection circuit RC can also detect the proximity of the object to the sensor SS (the distance in the third direction Z to the sensor SS) based on the level of the detection signal DS.

In the example illustrated in the drawing, the sensor SS acquires the pulsed detection signal (sensor output value) DS, at a lower level than pulses obtained from surrounding detection electrodes, from particular detection electrode RxO when the sensor drive signal TSVCOM is supplied to the particular sensor drive electrode TxO. The sensor SS supplies the acquired detection signal DS to the detection circuit RC. In the detection circuit RC, the sensor SS detects a two-dimensional position information of the object to be detected inside the XY plane of the sensor SS (for example, position information of the position PO or the like) and a degree of proximity of the object to be detected with respect to the XY plane of the sensor SS based on a timing at which the sensor drive signal TSVCOM is supplied to the particular sensor drive electrode TxO and the detection signal DS acquired by the particular detection electrode RxO.

Figure 6:
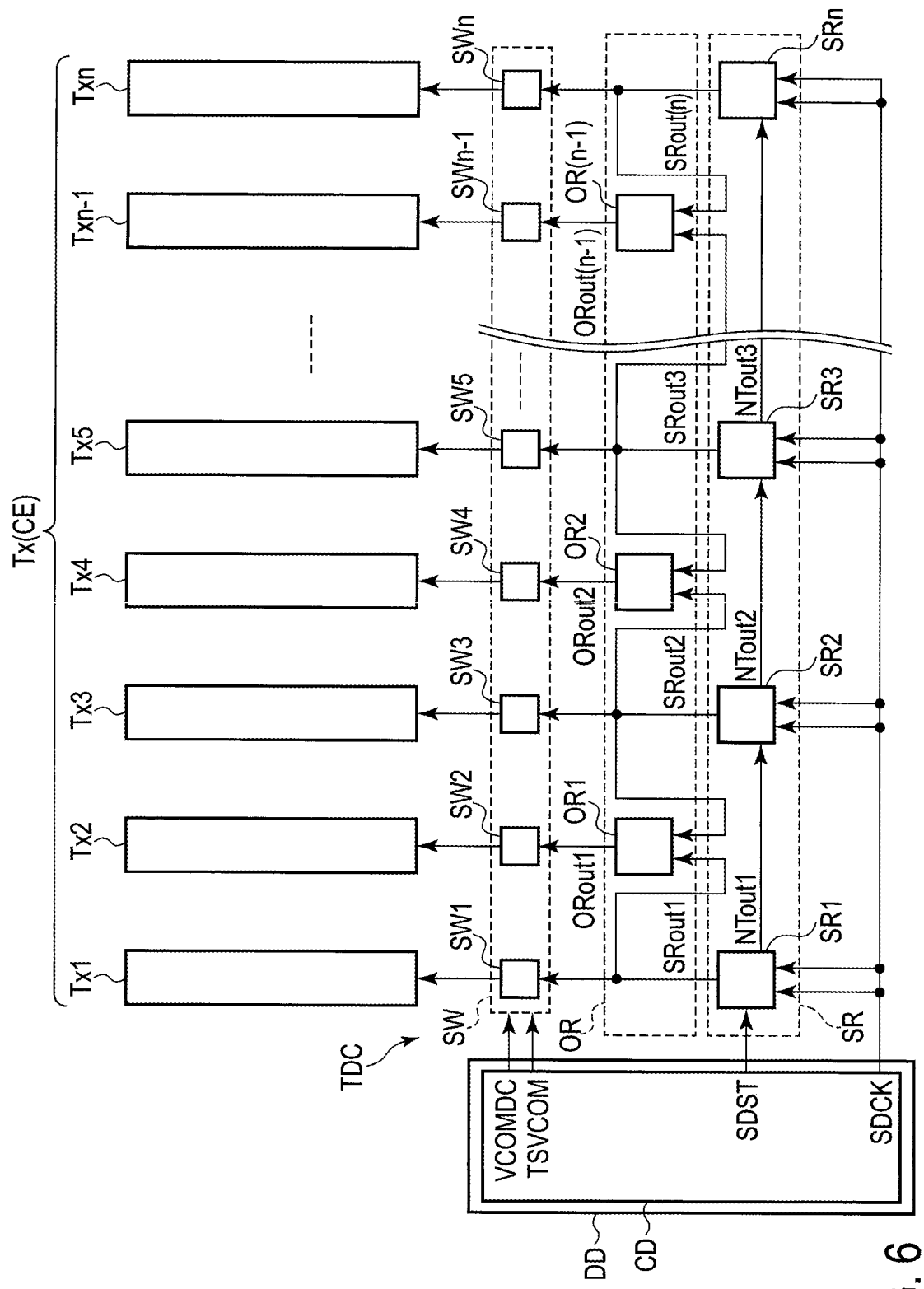
FIG. 6 is a schematic diagram illustrating a configuration example of a touch driving circuit according to the embodiment.

FIG. 6 is a schematic diagram illustrating a configuration example of the touch driving circuit TDC according to the embodiment.

The touch driving circuit TDC includes the plurality of shift registers SR (SR1, SR2, . . . , and SRn), the plurality of OR circuits OR (OR1, OR2, . . . , and ORn), and a plurality of switching circuits SW (SW1, SW2, . . . , SWn). In the example illustrated in the drawing, the plurality of shift registers SR and the OR circuits OR are alternately disposed and connected to the plurality of sensor drive electrodes Tx (CE), respectively. For example, the shift register SR1 is connected to the switching circuit SW1, the OR circuit OR1, and the shift register SR2. The switching circuit SW1 is connected to the sensor drive electrode (common electrode) Tx1. The shift register SR2 is connected to the switching circuit SW3, the OR circuits OR1 and OR2, and the shift register SR3. The OR circuit OR1 is connected to the switching circuit SW2. The switching circuit SW2 is connected to the sensor drive electrode (common electrode) Tx2. Similarly, the plurality of shift registers SR2, . . . , and SRn, the plurality of OR circuits OR2, . . . , and ORn, and the plurality of switching circuits SW3, . . . , and SWn are connected, respectively. In the touch driving circuit TDC, the plurality of shift registers SR and the plurality of OR circuits OR are alternately disposed, but are not necessarily disposed in an alternate manner. In addition, the touch driving circuit TDC does not necessarily include the plurality of OR circuits OR, and may include at least one OR circuit OR. In addition, it may be configured such that a circuit group of the shift registers SR is disposed at a lower stage, a circuit group of the OR circuits OR is disposed at an upper stage, and the OR circuit OR is disposed between the shift registers SR as shown in FIG. 6. Further, the shift registers SR and the OR circuits OR may be disposed at the same stage, that is, to be aligned in a straight line as shown in FIG. 4.

The shift registers SR sequentially transmit input signals at a particular cycle and output output signals SRout (SRout1, SRout2, . . . , and SRout(n)) from the shift registers at the respective stages. The OR circuits (OR circuit) OR receive the output signals from some shift registers among the shift registers SR and output output signals ORout (ORout1, ORout2, . . . , and ORout(n)). For example, the OR circuit OR is a circuit which has a plurality of input terminals and one output terminal and outputs 1 when "1" is input to at least one input terminal. In the example illustrated in the drawing, a transfer start pulse SDST and a transfer clock SDCK are supplied from the common electrode driving circuit CD to the shift register SR1 among the plurality of shift registers SR. The plurality of shift registers SR sequentially transmit the transfer start pulse SDST in accordance with the transfer clock SDCK, and output the output signals from the shift registers at the respective stages. For example, the shift register SR1 outputs the output signal SRout1 to the switching circuit SW1 and the OR circuit OR1 based on the transfer start pulse SDST and the transfer clock SDCK that have been input thereto. The shift register SR1 outputs an output signal NTout1 to the shift register SR2 based on the transfer start pulse SDST and the transfer clock SDCK. Here, the output signal NTout1 corresponds to a transfer start pulse of the shift register SR2 at the next stage. The OR circuit OR1 receives the output signal SRout1 from the shift register SR1 and the output signal SRout2 from the shift register SR2, and outputs the output signal ORout1 to the switching circuit SW2. The shift register SR2 receives the output signal NTout1 and the transfer clock SDCK, and outputs the output signal SRout2 to the switching circuit SW3 and the OR circuits OR1 and OR2. The OR circuit OR1 receives the output signal SRout2 and outputs the output signal ORout1 to the switching circuit SW3. The OR circuit OR2 receives the output signal SRout2 and outputs the output signal ORout2 to the switching signal SW4. The shift register SR2 outputs an output signal NTout2 to the shift register SR3 based on the transfer start pulse SDST and the transfer clock SDCK. Here, the output signal NTout2 corresponds to a transfer start pulse of the shift register SR3 at the next stage. These signal processes are sequentially executed by the plurality of shift registers SR3, . . . , and SRn and the plurality of OR circuits OR3 (not illustrated), . . . , and ORn−1 in the same manner.

The switching circuit SW switches a wiring of a signal to be supplied to the sensor drive electrode Tx that has been selected among the sensor drive electrodes Tx according to the output signal SRout from the shift register SR and the output signal ORout from the OR circuit OR. In the example illustrated in the drawing, when receiving the output signal indicating the touch position detection period from the shift register SR or the OR circuit OR, the switching circuit SW performs switching to a wiring to supply the sensor drive signal TSVCOM, that is, the drive pulse TSVCOM to the selected sensor drive electrode among the sensor drive electrodes Tx. On the other hand, when receiving the output signal indicating an image display period from the shift register SR or the OR circuit OR, the switching circuit SW performs switching to a wiring to supply the common driving signal VCOMDC to the selected sensor drive electrode among the sensor drive electrodes Tx. For example, when the output signal of the shift register SR or the OR circuit OR is "H: High", the switching circuit SW performs switching to the wiring to supply the sensor driving signal TSVCOM to the selected sensor drive electrode among the sensor drive electrodes Tx. On the other hand, when the output signal of the shift register SR or the OR circuit OR is "L: Low", the switching circuit SW performs switching to the wiring to supply the common driving signal VCOMDC to the selected sensor drive electrode among the sensor drive electrodes Tx.

Figure 7:
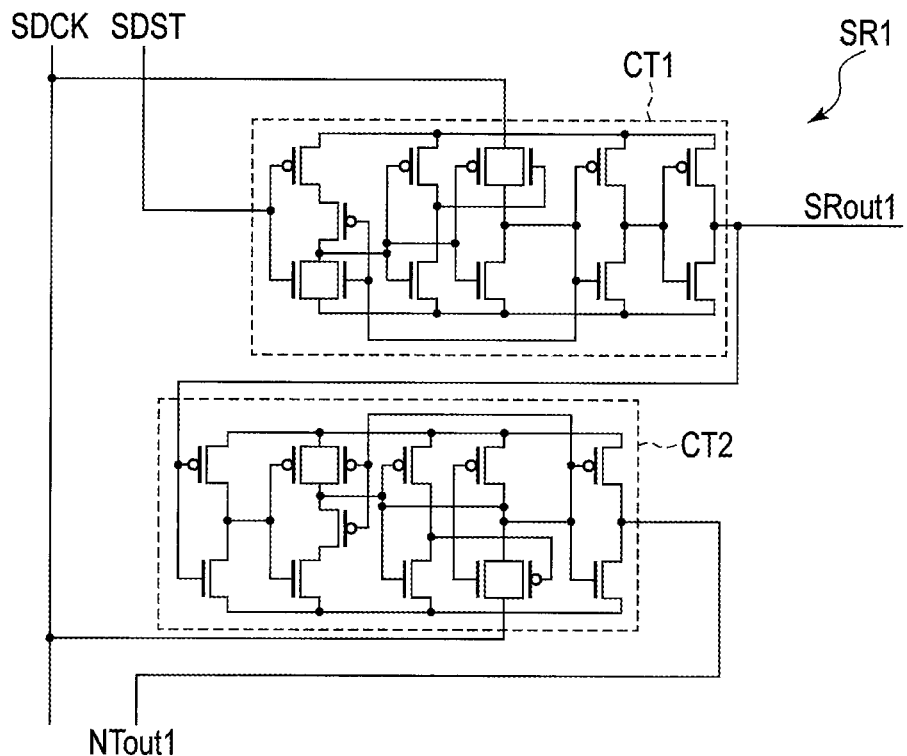
FIG. 7 is a circuit diagram illustrating a configuration example of a shift register.

FIG. 7 is a circuit diagram illustrating a configuration example of the shift register SR1.

An example of a circuit configuration of the shift register SR1 will be described as an example of the plurality of shift registers SR. It should be noted that the same circuit configuration as that of the shift register SR1 can be applied to the plurality of shift registers SR2, SR3, . . . , and SRn other than the shift register SR1.

In the example illustrated in the drawing, the shift register SR1 includes a first circuit unit CT1 and a second circuit unit CT2. The transfer start pulse SDST and the transfer clock SDCK are supplied from the common electrode driving circuit CD to the first circuit unit CT1. The first circuit unit CT1 generates the output signal SRout1 based on the transfer start pulse SDST and the transfer clock SDCK. The first circuit unit CT1 outputs the output signal SRout1 to the second circuit unit CT2 and the outside, for example, the switching circuit SW1 and the OR circuit OR1. The transfer clock SDCK is supplied from the common electrode driving circuit CD, and the output signal SRout1 is supplied from the first circuit unit CT1, to the second circuit unit CT2. The second circuit unit CT2 generates the output signal NTout1 based on the transfer clock SDCK and the output signal SRout1. The second circuit unit CT2 outputs the output signal NTout1 to the outside, for example, the shift register SR2 at the next stage. It should be noted that the circuit configuration of the shift register SR shown in FIG. 7 is mere an example, and other circuit configurations may be adopted as long as the same output signal SRout as that of the circuit configuration example shown in FIG. 7 is obtained.

Figure 8:
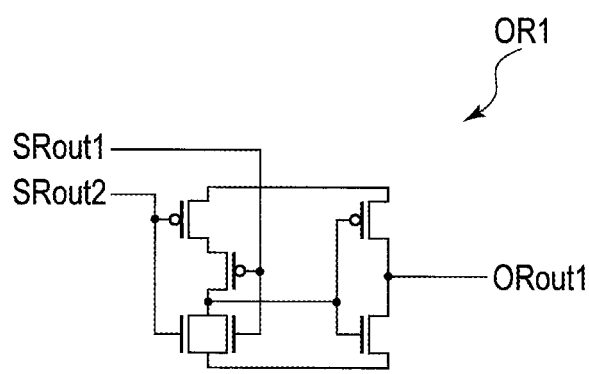
FIG. 8 is a circuit diagram illustrating a configuration example of an OR circuit.

FIG. 8 is a circuit diagram illustrating a configuration example of the OR circuit OR1.

The configuration example of the OR circuit OR1 will be described as an example of the plurality of OR circuits OR. It should be noted that the same configuration as the OR circuit OR1 can be applied to the plurality of OR circuits OR2, OR3, . . . , and ORn−1 other than the OR circuit OR1.

In the example illustrated in the drawing, the OR circuit OR1 receives the output signal SRout1 from the shift register SR1 and the output signal SRout2 from the shift register SR2, and outputs the output signal ORout1. For example, the OR circuit OR1 outputs the output signal ORout1 of "H" when at least one of the output signals SRout1 and SRout2 is "H".

Figure 9:
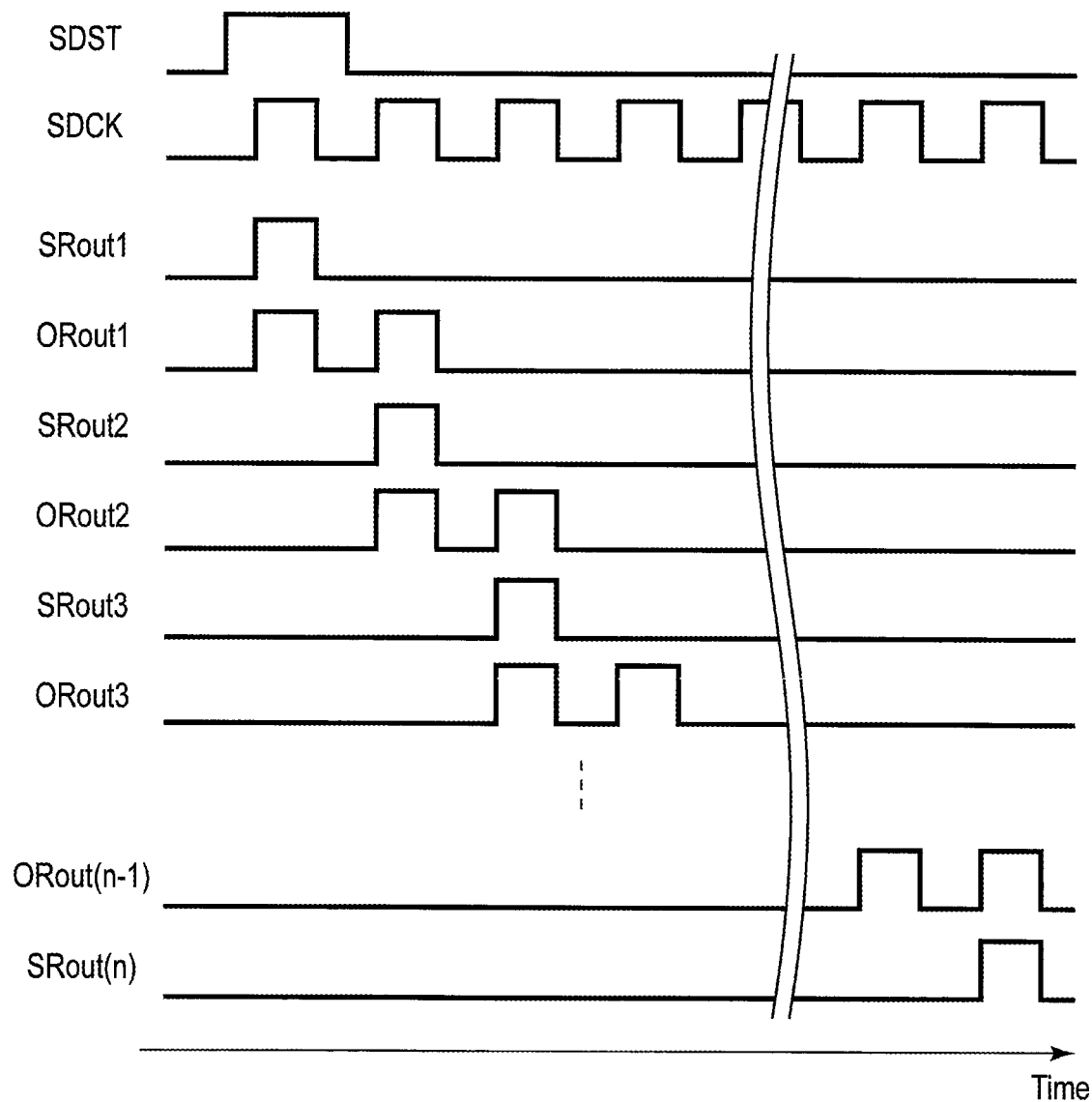
FIG. 9 is a timing chart illustrating an example of each operation of the shift register and the OR circuit of the touch driving circuit.

FIG. 9 is a timing chart illustrating an example of each operation of the shift register SR and the OR circuit OR of the touch driving circuit TDC. FIG. 9 illustrates the example of the operations of the shift register SR and the OR circuit OR during sensing of one frame. In FIG. 9, the horizontal axis represents time.

The common electrode driving circuit CD can set the number of common drive electrodes and a position to be sensed depending on the number of times of changes of a pulse of the transfer clock SDCK during a period in which a signal of the transfer start pulse SDST rises, that is, the transfer start pulse SDST is "H". The common electrode driving circuit CD supplies the transfer start pulse SDST of "H" to the shift register SR at the start of one frame in the touch position detection period. The common electrode driving circuit CD supplies a pulse of the transfer clock SDCK whose signal changes a particular number of times, to the shift register SR during the period in which the signal of the transfer start pulse SDST rises. It should be noted that the common electrode driving circuit CD may generate the transfer start pulse SDST a plurality of times in one frame. In addition, the common electrode driving circuit CD can use a plurality of the transfer clocks SDCK according to the specification.

During the period in which the signal of the transfer start pulse rises, the shift register SR outputs output signals of "H" from the particular number of shift registers at a particular position based on the number of times that the pulse of the transfer clock SDCK supplied from the common electrode driving circuit CD changes. For example, the shift register SR can select the same number of shift registers at previous stages as the number of times of changes of the pulse of the transfer clock SDCK when the signal of the transfer start pulse SDST from the common electrode driving circuit CD is "H", and output the output signals of "H" from the same number of shift registers as the number of times of changes.

In addition, the OR circuit OR outputs an output signal of "H" according to the output signal from the shift register SR. As shown in FIG. 6, when the OR circuits OR and the shift registers SR are alternately disposed, the OR circuit OR outputs the output signal according to the output signals of the two adjacent shift registers. For example, the OR circuit OR outputs the output signal of "H" when at least one of the output signals of the two adjacent shift registers connected thereto is the output signal of "H".

In the example illustrated in the drawing, the common electrode driving circuit CD changes the signal of the transfer clock SDCK only once during a period in which the signal of the transfer start pulse SDST is "H", for the touch driving circuit having the configuration example of FIG. 6. Thus, when the transfer start pulse SDST and the transfer clock SDCK are supplied from the common electrode driving circuit CD, the shift register SR1 outputs the output signal SRout1 in which the signal rises once according to the transfer clock SDCK. The OR circuit OR1 receives the output signal SRout1 from the shift register SR1 and outputs the output signal ORout1 in which the signal rises once, simultaneously with the output signal SRout1. Next, the shift register SR2 receives the output signal NTout1 from the shift register SR1 and the transfer clock SDCK, performs shift from the output signal ORout1 according to the transfer clock SDCK, and outputs an output signal SRout2 in which the signal rises once. The OR circuit OR1 receives the output signal of the shift register SR2 and outputs the output signal ORout1 in which the signal rises once, simultaneously with the output signal SRout2. In addition, the OR circuit OR2 also receives the output signal SRout2 of the shift register SR2 and outputs the output signal ORout2 in which the signal rises once, simultaneously with the output signal SRout2. Similarly, the other plurality of shift registers SR3, . . . , and SRn also output the output signals SRout3, . . . , and SRout(n) in which the signal rises once based on the output signals SRout2, . . . , and SRout(n−1) of the shift registers at the respective stages and the transfer clock SDCK, respectively. The other plurality of OR circuits OR3, . . . , and ORn−1 output the out signals ORout3, . . . , and ORout(n−1) in which the signal rises once when at least one output signal among output signals of two connected shift registers is "H" based on the output signals SRout2, . . . , and SRout(n−1) of the shift registers at the respective stages.

Figure 10:
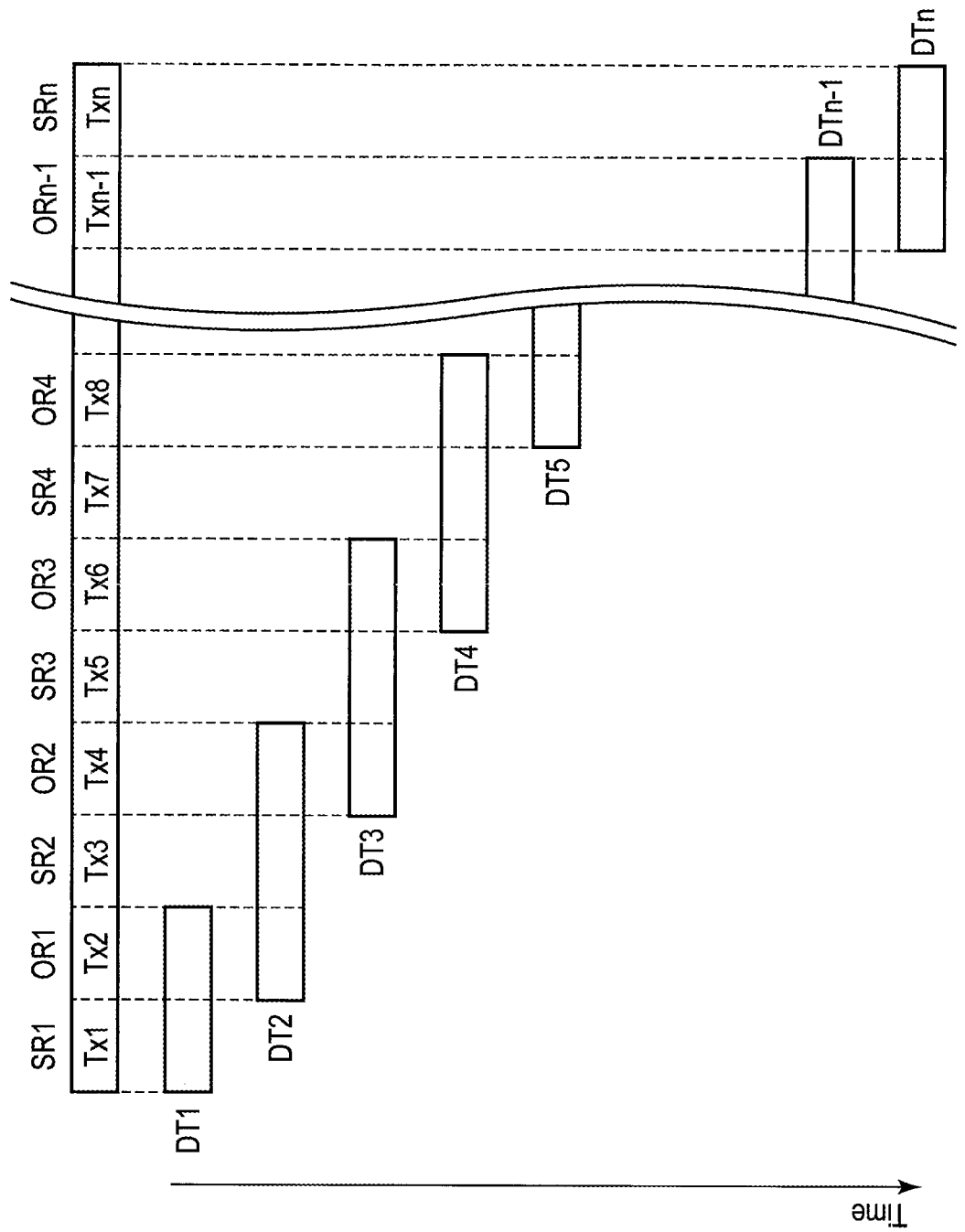
FIG. 10 is a diagram illustrating an example of an operation of the sensor based on the operations of the shift register and the OR circuit shown in FIG. 9.

FIG. 10 is a diagram illustrating an example of an operation of the sensor SS based on the operations of the shift register SR and the OR circuit OR shown in FIG. 9. FIG. 10 illustrates the example of the operation of the sensor SS during sensing of one frame. In FIG. 10, the vertical axis represents time.

The sensor SS supplies the sensor drive signal TSVCOM to at least one sensor drive electrode selected among the sensor drive electrodes Tx in the touch position detection period based on output signals from the shift register SR and the OR circuit OR to execute sensing.

In the example illustrated in the drawing, each of the plurality of shift registers SR1, SR2, SR3, . . . , and so on outputs an output signal to one end, for example, to a plurality of odd-numbered sensor drive electrodes Tx1, Tx3, Tx5, and so on counted from the shift register SR1. On the other hand, each of the OR circuits OR1, OR2, OR3, . . . , and so on outputs the output signal to one end, for example, to a plurality of even-numbered sensor drive electrodes counted from the shift register SR1. Therefore, the sensor SS first executes sensing on the selected sensor drive electrodes Tx1 and Tx2 in a touch position detection period DT1 based on the timing chart of FIG. 9. Next, the sensor SS executes sensing on the selected sensor drive electrodes Tx2, Tx3, and Tx4 in a touch position detection period DT2. Next, the sensor SS executes sensing on the selected sensor drive electrodes Tx4, Tx5, and Tx6 in a touch position detection period DT3. Similarly, the sensor SS sequentially executes sensing for each of at least two selected sensor drive electrodes in each of touch position detection periods DT4, . . . , and DTn based on the output signals from the shift register SR and the OR circuit OR. In the example illustrated in the drawing, the sensor SS executes sensing so that at least one sensor drive electrode overlaps in each touch position detection period, but by performing sensing in this manner, the sensor SS accurately senses an object to be detected Detection becomes possible. In addition, the sensor SS can designate the touch position detection period based on the transfer clock SDCK in the example illustrated in the drawing. Thus, it is unnecessary for the sensor SS to include a circuit that outputs a signal to designate the touch position detection period, and accordingly, it is possible to simplify the circuit. For example, it is necessary for the sensor SS to include the circuit that outputs the signal to designate the touch position detection period when the pulse of the transfer clock SDCK changing a plurality of times is supplied to the shift register SR and the like during the period in which the transfer start pulse SDST is "H".

According to the display device DSP including the sensor SS described above, the detection electrode Rx provided in the second substrate SUB2 is connected to the pad P provided on the first substrate SUB1 using the connecting material C provided in the contact hole V. Thus, it is unnecessary to mount the wiring board configured to connect the detection electrode Rx and the detection circuit RC on the second substrate SUB2. That is, the wiring board SUB3 mounted on the first substrate SUB1 forms a transmission path configured to transmit a signal necessary for display of an image on the display panel PNL, and forms a transmission path configured to transmit a signal between the detection electrode Rx and the detection circuit RC. Therefore, it is possible to reduce the number of wiring boards as compared to the configuration example in which the separate wiring board is required in addition to the wiring board SUB3. In addition, the space for connecting the wiring board to the second substrate SUB2 is unnecessary, and thus, it is possible to reduce a width of the non-display area of the display panel PNL, and particularly, an edge side on which the wiring board SUB3 is mounted. This makes it possible to narrow the frame.

According to the embodiment, the display device DSP with the sensor function includes at least the single OR circuit in the touch driving circuit TDC provided on the upper surface of the first substrate SUB1. The OR circuit OR is simple as a circuit when compared to the shift register SR. In addition, the display device DPS with the sensor function can simplify the circuit to designate the touch position detection period by configuring the touch driving circuit TDC using the shift register SR and the OR circuit OR. Therefore, it is possible to reduce the size of the touch driving circuit TDC. As a result, it is possible to provide the display device DSP capable of narrowing the frame according to the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor comprising:
   a first sensor drive electrode;
   a second sensor drive electrode disposed to be adjacent to the first sensor drive electrode;
   a third sensor drive electrode disposed to be adjacent to the second sensor drive electrode; and
   a touch driving circuit comprising a first shift register circuit, a second shift register circuit, an OR circuit, a first switching circuit, a second switching circuit, and a third switching circuit, wherein
   the first shift register circuit is connected to the first sensor drive electrode;
   the second shift register circuit is connected to the first shift register circuit and the third sensor drive electrode;
   the OR circuit is connected to the second sensor drive electrode, the first shift register circuit, and the second shift register circuit;
   the first switching circuit is located between the first shift register circuit and the first sensor drive electrode, and is connected to the first shift register circuit and the first sensor drive electrode;
   the second switching circuit is located between the OR circuit and the second sensor drive electrode, and is connected to the OR circuit and the second sensor drive electrode;
   the third switching circuit is located between the second shift register circuit and the third sensor drive electrode, and is connected to the second shift register circuit and the third sensor drive electrode; and
   the first to third switching circuits switch to supply a sensor drive signal in a touch position detection period and a common driving signal in an image display period.

2. The sensor of claim 1, wherein
   the first shift register circuit outputs a first output signal that enables selection of the first sensor drive electrode to the first sensor drive electrode and outputs a second output signal that drives the second shift register circuit to the second shift register circuit, the second shift register circuit receives the second output signal from the first shift register circuit and outputs a third output signal that enables selection of the third sensor drive electrode to the third sensor drive electrode, and the OR circuit receives the first output signal and the third output signal and outputs a fourth output signal that enables selection of the second sensor drive electrode to the second sensor drive electrode.

3. The sensor of claim 1, wherein the first shift register circuit outputs a first output signal that enables selection of the first sensor drive electrode to the first sensor drive electrode and outputs a second output signal that drives the second shift register circuit to the second shift register circuit, the second shift register circuit receives the second output signal from the first shift register circuit and outputs a third output signal that enables selection of the third sensor drive electrode to the third sensor drive electrode, and the OR circuit receives at least one of the first output signal and the third output signal and outputs a fourth output signal that enables selection of the second sensor drive electrode to the second sensor drive electrode.

4. The sensor of claim 2, further comprising a driver which inputs a start pulse signal and a clock signal to the first shift register circuit, and supplies a drive signal configured to detect a proximity object with respect to the first sensor drive electrode and the second sensor drive electrode set to be selectable by the first shift register circuit and the OR circuit.

5. The sensor of claim 4, wherein the driver outputs the clock signal which changes once in a rise period of the start pulse signal.

6. The sensor of claim 5, wherein the driver designates the touch position detection period in which a proximity object is detected by the clock signal.

7. The sensor of claim 6, further comprising a detection electrode which is opposed to the first sensor drive electrode, the second sensor drive electrode, and the third sensor drive electrode, and forms a capacitance with each of the first sensor drive electrode, the second sensor drive electrode, and the third sensor drive electrode.

8. The sensor of claim 7, further comprising:

a first substrate which comprises the first sensor drive electrode, the second sensor drive electrode, the third sensor drive electrode, a first pad connected to the detection electrode, a second pad connected to the detection electrode, and a third pad connected to the detection electrode;

a second substrate which is opposed to the first substrate, and separated from the first pad, the second pad, and the third pad, and comprises an insulating substrate comprising a first hole and the detection electrode;

a connecting material which electrically connects at least one of the first pad, the second pad, and the third pad to the detection electrode via the first hole; and a wiring board which is connected to the first substrate and comprises the driver electrically connected to the first pad, the second pad, and the third pad.

9. The sensor of claim 1, wherein the OR circuit outputs a high-level signal when a level of at least one of a plurality of supplied signals is a high level.

* * * * *